United States Patent
Lee (10) Patent No.: US 8,723,708 B2
(45) Date of Patent: May 13, 2014

(54) SUCCESSIVE APPROXIMATION ANALOG TO DIGITAL CONVERTER AND CONVERSION METHOD THEREOF

(71) Applicant: Realtek Semiconductor Corporation, Hsinchu (TW)

(72) Inventor: Chao-Cheng Lee, Hsinchu (TW)

(73) Assignee: Realtek Semiconductor Corporation, Hsinchu (TW)

( * ) Notice: Subject to any disclaimer, the term of this patent is extended or adjusted under 35 U.S.C. 154(b) by 0 days.

(21) Appl. No.: 13/728,760

(22) Filed: Dec. 27, 2012

(65) Prior Publication Data

US 2013/0169465 A1    Jul. 4, 2013

Related U.S. Application Data

(60) Provisional application No. 61/581,616, filed on Dec. 29, 2011.

(51) Int. Cl.
*H03M 1/00* (2006.01)

(52) U.S. Cl.
USPC .......................................... 341/122; 341/120

(58) Field of Classification Search
USPC ......... 341/122, 120, 118, 155, 156, 110, 172, 341/150, 158; 375/365, 376, 340
See application file for complete search history.

(56) References Cited

U.S. PATENT DOCUMENTS

| | | | |
|---|---|---|---|
| 8,542,616 B2 * | 9/2013 | Staszewski et al. | 370/295 |
| 2011/0090998 A1 * | 4/2011 | Zhang | 375/365 |

* cited by examiner

*Primary Examiner* — Joseph Lauture
(74) *Attorney, Agent, or Firm* — Christensen Fonder P.A.

(57) ABSTRACT

A successive approximation analog to digital converter and a conversion method thereof are provided. The successive approximation analog to digital converter includes a sample circuit, a conversion circuit, and a filtering control circuit. The sample circuit is configured to sample an analog voltage from an analog signal. The conversion circuit is configured to convert the analog voltage into a digital voltage. The filtering control circuit is configured to transmit a filtering control signal to the sample circuit according to the digital voltage. The sample circuit further samples a next analog voltage from the analog signal and adjusts the next analog voltage into an adjusted analog voltage according to the filtering control signal. The conversion circuit further converts the adjusted analog voltage into a next digital voltage, wherein the next digital voltage is a filtered digital voltage.

18 Claims, 4 Drawing Sheets

SUCCESSIVE APPROXIMATION ANALOG TO DIGITAL CONVERTER AND CONVERSION METHOD THEREOF

This application claims priority to U.S. Provisional Patent Application No. 61/581,616 filed on Dec. 29, 2011, which is hereby incorporated by reference in its entirety.

CROSS-REFERENCES TO RELATED APPLICATIONS

Not applicable.

BACKGROUND OF THE INVENTION

1. Field of the Invention

The present invention relates to a successive approximation analog to digital (A/D) converter and a conversion method thereof More particularly, the present invention relates to a successive approximation A/D converter with a filtering function and a conversion method thereof.

2. Descriptions of the Related Art

Analog to digital (A/D) converters play a very important role in the digital times. The A/D converters are viewed as bridges between analog signals and digital signals, and are mainly used to convert the analog signals into digital signals so that the converted digital signals conform to signal formats required in digital circuits. Then, the digital signals can be processed by subsequent digital circuit stages. There are many types of A/D converters, examples of which include flash-type A/D converters, pipeline-type A/D converters, and successive approximation A/D converters that have become more popular over recent years, and so on.

In practical applications, an analog signal is often passed through a filter first to filter out unnecessary bands of the analog signal before it is fed into an A/D converter. This can make the band of the filtered analog signal conformable to specifications of the A/D converter so that the filtered analog signal is more suitable for subsequent conversion. Alternatively, after the analog signal is converted into a digital signal, a digital filter is then used to filter the digital signal. However, the additional filter will increase the area of the whole circuit and manufacturing costs. Therefore, it is a great challenge for related manufacturers to make a compromise between the manufacturing cost and conversion performances.

In view of this, an urgent need exists in the art to provide a solution capable of imparting a filtering function to a conventional A/D converter so that desirable signal conversion performances can be achieved at a low cost.

SUMMARY OF THE INVENTION

To solve the aforesaid problem, the present invention provides a successive approximation analog to digital (A/D) converter and a conversion method thereof In detail, the successive approximation A/D converter and the conversion method thereof of the present invention can adjust an analog voltage currently sampled according to a digital voltage obtained from at least a previous conversion. Thereby, after the analog voltage currently sampled is converted into another digital voltage, the another digital voltage will have already been filtered simultaneously.

Because the successive approximation A/D converter and the conversion method thereof of the present invention can achieve an equivalent filtering effect without using an additional filter, the circuit area and cost can be effectively reduced as compared to the conventional A/D converter where an additional filter must be used to provide the filtering function.

To achieve the aforesaid objective, the present invention provides a successive approximation A/D converter. The successive approximation A/D converter comprises a sample circuit, a conversion circuit and a filtering control circuit. The sample circuit is for sampling an analog voltage from an analog signal. The conversion circuit coupled to the sample circuit is for converting the analog voltage into a digital voltage. The filtering control circuit coupled to the sample circuit and the conversion circuit is for transmitting a filtering control signal to the sample circuit according to the digital voltage. The sample circuit further samples a next analog voltage from the analog signal and adjusts the next analog voltage into an adjusted analog voltage according to the filtering control signal. The conversion circuit further converts the adjusted analog voltage into a next digital voltage, wherein the next digital voltage is a filtered digital voltage.

To achieve the aforesaid objective, the present invention further provides a conversion method for a successive approximation A/D converter. The successive approximation A/D converter comprises a sample circuit, a conversion circuit and a filtering control circuit. The conversion circuit is coupled to the sample circuit, and the filtering control circuit is coupled to the sample circuit and the conversion circuit. The conversion method comprises the following steps of:

(a) enabling the sample circuit to sample an analog voltage from an analog signal;

(b) enabling the conversion circuit to convert the analog voltage into a digital voltage;

(c) enabling the filtering control circuit to transmit a filtering control signal to the sample circuit according to the digital voltage;

(d) enabling the sample circuit to sample a next analog voltage from the analog signal and adjust the next analog voltage into an adjusted analog voltage according to the filtering control signal; and (e) enabling the conversion circuit to convert the adjusted analog voltage into a next digital voltage, wherein the next digital voltage is a filtered digital voltage.

The detailed technology and preferred embodiments implemented for the subject invention are described in the following paragraphs accompanying the appended drawings for persons skilled in this field to well appreciate the features of the claimed invention.

DESCRIPTION OF THE PREFERRED EMBODIMENT

The present invention will be further explained with reference to the following embodiments. However, these embodiments are not intended to limit the present invention to environments, applications or implementations described in these embodiments. Therefore, the description of these embodiments is only for the purpose of illustration rather than to limit the present invention. Furthermore, for simplicity of description, in the following embodiments and the attached drawings, elements not directly related to the present invention are omitted from depiction.

Figure 1:
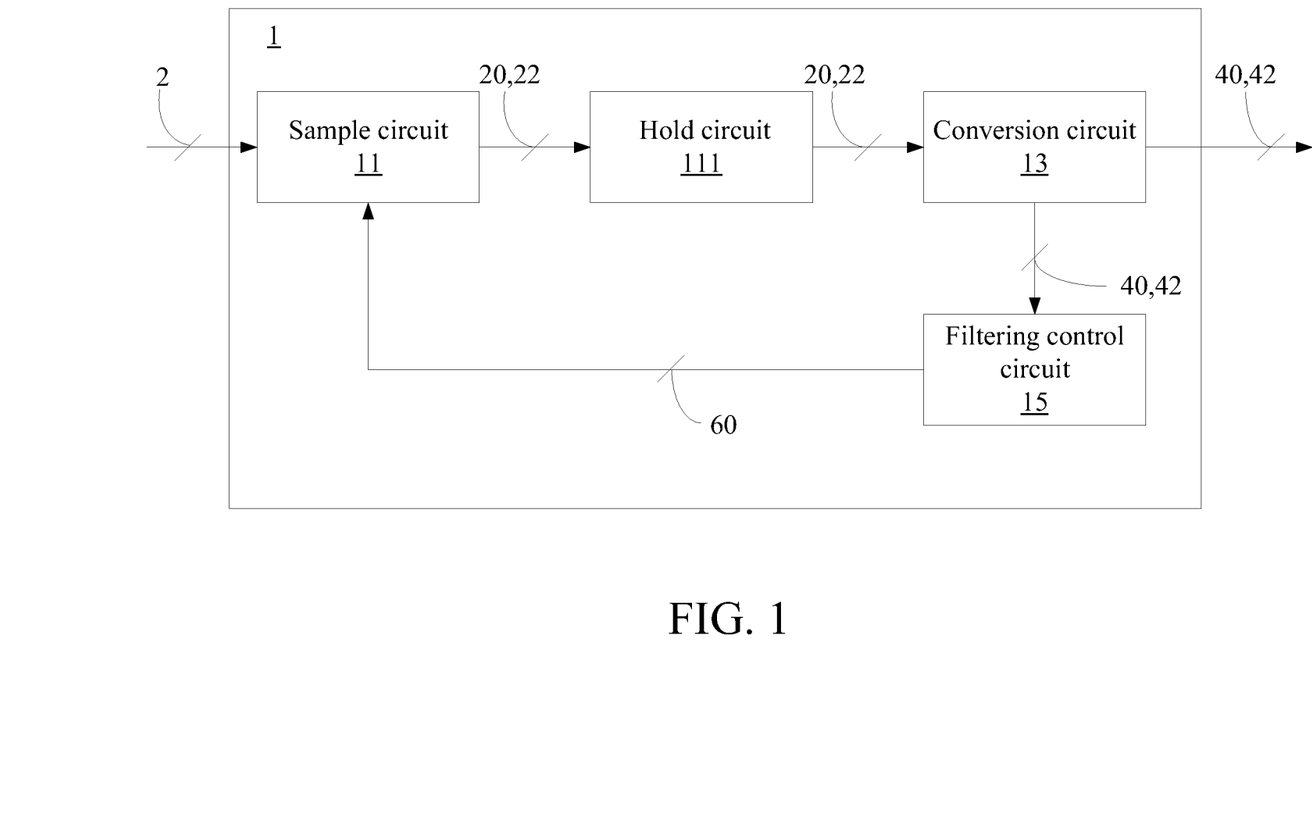
FIG. 1 is a schematic view of a successive approximation A/D converter 1 according to a first embodiment of the present invention.

A first embodiment of the present invention is a successive approximation analog to digital (A/D) converter, which will be elucidated with reference to FIG. 1. FIG. 1 is a schematic view of a successive approximation A/D converter 1 of this embodiment. The successive approximation A/D converter 1 comprises a sample circuit 11, a hold circuit 111, a conversion circuit 13 and a filtering control circuit 15. In this embodiment, the sample circuit 11 is coupled to the conversion circuit 13 via the hold circuit 111. The filtering control circuit 15 is coupled to the sample circuit 11 and the conversion circuit 13. The sample circuit 11 has a function of taking a sample from an analog signal 2. In a first sampling period, the sample circuit 11 samples an analog voltage 20 from the analog signal 2. The hold circuit 111 has a function of holding the analog voltage 20 sampled by the sample circuit 11 so that the sampled analog voltage 20 can be stably inputted to the conversion circuit 13 to facilitate subsequent conversion. It shall be appreciated that the hold circuit 111 may be viewed as a part of the sample circuit 11; that is, the hold circuit 111 may be combined in the sample circuit 11 rather than being independent of the sample circuit 11. In this way, the sample circuit 11 can be coupled to the conversion circuit 13 directly without affecting the normal operation of the successive approximation A/D converter 1 of this embodiment.

The conversion circuit 13 has a function of converting the analog voltage 20 into a digital voltage 40. Generally speaking, the conversion circuit 13 may comprise a comparator, a digital to analog (D/A) converter and a controller. The D/A converter is configured to supply a prediction voltage. The comparator is configured to compare the prediction voltage with the analog voltage 20. The controller controls the D/A converter by a binary search algorithm according to an output result of the comparator so that the prediction voltage outputted by the D/A converter approximates the analog voltage 20 successively. This is the basic process flow of the conversion performed by the successive approximation A/D converter. The detailed processes of the aforesaid conversion performed by the conversion circuit 13 can be readily appreciated by those of ordinary skill in the art, so they will not be further described herein.

The filtering control circuit 15 has a function of transmitting a filtering control signal 60 to the sample circuit 11 according to the digital voltage 40 outputted by the conversion circuit 13. Thereby, the subsequent sampling operation of the sample circuit 11 is controlled to impart a filtering function to the successive approximation A/D converter 1. For a time-domain signal, the process of changing a current sample value according to at least one previous sample value is substantially equivalent to filtering the time-domain signal.

For example, if each sample value of a time-domain signal is equal to that of the original sample value thereof minus a previous sample value, then there is an amplification effect on the values of the time-domain signal that vary rapidly while there is a reduction effect on the values of the time-domain signal that vary slowly. Consequently, the aforesaid operation can be substantially viewed as a kind of high-pass filtering behavior for the time-domain signal. Otherwise, if each sample value of a time-domain signal is equal to that of the original sample value thereof plus a previous sample value, then there is a reduction effect on the values of the time-domain signal that vary rapidly while there is an amplification effect on the values of the time-domain signal that vary slowly. Consequently, the aforesaid operation can be substantially viewed as a kind of low-pass filtering behavior for the time-domain signal.

The successive approximation A/D converter 1 of this embodiment operates based on the aforesaid principle to perform the filtering operation during the process of converting the analog signal 2 into a digital signal. In detail, after the digital voltage 40 is outputted by the conversion circuit 13, the sample circuit 11 will take a sample from the analog signal 2 again. In a second sampling period, the sample circuit 11 samples a next analog voltage 21 (not shown) from the analog signal 2 and adjusts the next analog voltage 21 into an adjusted analog voltage 22 according to the filtering control signal 60.

The process in which the sample circuit 11 adjusts the next analog voltage 21 into an adjusted analog voltage 22 according to the filtering control signal 60 is equivalent to filtering the next analog voltage 21. After the conversion circuit 13 converts the adjusted analog voltage 22 into a next digital voltage 42, the next digital voltage 42 is substantially a filtered digital voltage. In other words, the next digital voltage 42 outputted by the conversion circuit 13 is substantially equivalent to a voltage that has been filtered by a filter.

Specifically, the next digital voltage 42 is generated according to the next analog voltage 21 and the digital voltage 40. For example, suppose that the next digital voltage 42 is equal to the next analog voltage 21 minus a product of the digital voltage 40 with a filtering factor (which may be adjusted according to the different filtering requirements) after the next analog voltage 21 is adjusted by the sample circuit 11. Then, the next digital voltage 42 after being converted by the conversion circuit 13 can be substantially viewed as a voltage that has been filtered by a high-pass filter, so a high-pass filtering characteristic is obtained. On the other hand, suppose that the next digital voltage 42 is equal to the next analog voltage 21 plus a product of the digital voltage 40 with a filtering factor (which may be adjusted according to the different filtering requirements) after the next analog voltage 21 is adjusted by the sample circuit 11. Then, the next digital voltage 42, which is being converted by the conversion circuit 13, can be substantially viewed as a voltage that has been filtered by a low-pass filter, so a low-pass filtering characteristic can be obtained. It shall be appreciated that when the successive approximation A/D converter 1 needs to have a band-pass filtering function or a band-rejection filtering function, the successive approximation A/D converter 1 may also be designed through a process flow similar to what has been described above, and thus, will not be further described herein.

It shall be appreciated that the successive approximation A/D converter 1 of this embodiment is not limited to performing the sampling and conversion process twice, and the number of times that the sampling and conversion process take place can be determined depending on the designer's needs. Furthermore, the filtering control circuit 15 may also generate and transmit the filtering control signal 60 to the sample circuit 11 according to a plurality of digital voltages 40 previously outputted by the conversion circuit 13 instead of only a single digital voltage 40 previously outputted by the conversion circuit 13. For example, in different time periods, a plurality of analog voltages 20 may be sampled by the sample circuit 11 from the analog signal 2 and then converted into a plurality of digital voltages 40 by the conversion circuit 13. The filtering control circuit 15 generates and transmits the filtering control signal 60 to the sample circuit 11 according to the digital voltages 40 outputted by the conversion circuit 13.

Through the aforesaid operations of this embodiment, the output result obtained after the analog signal 2 is converted by the successive approximation A/D converter 1 will be equivalent to an output result that is obtained after the analog signal 2 is first passed through a filter and then converted by a conventional successive approximation A/D converter.

Figure 2:
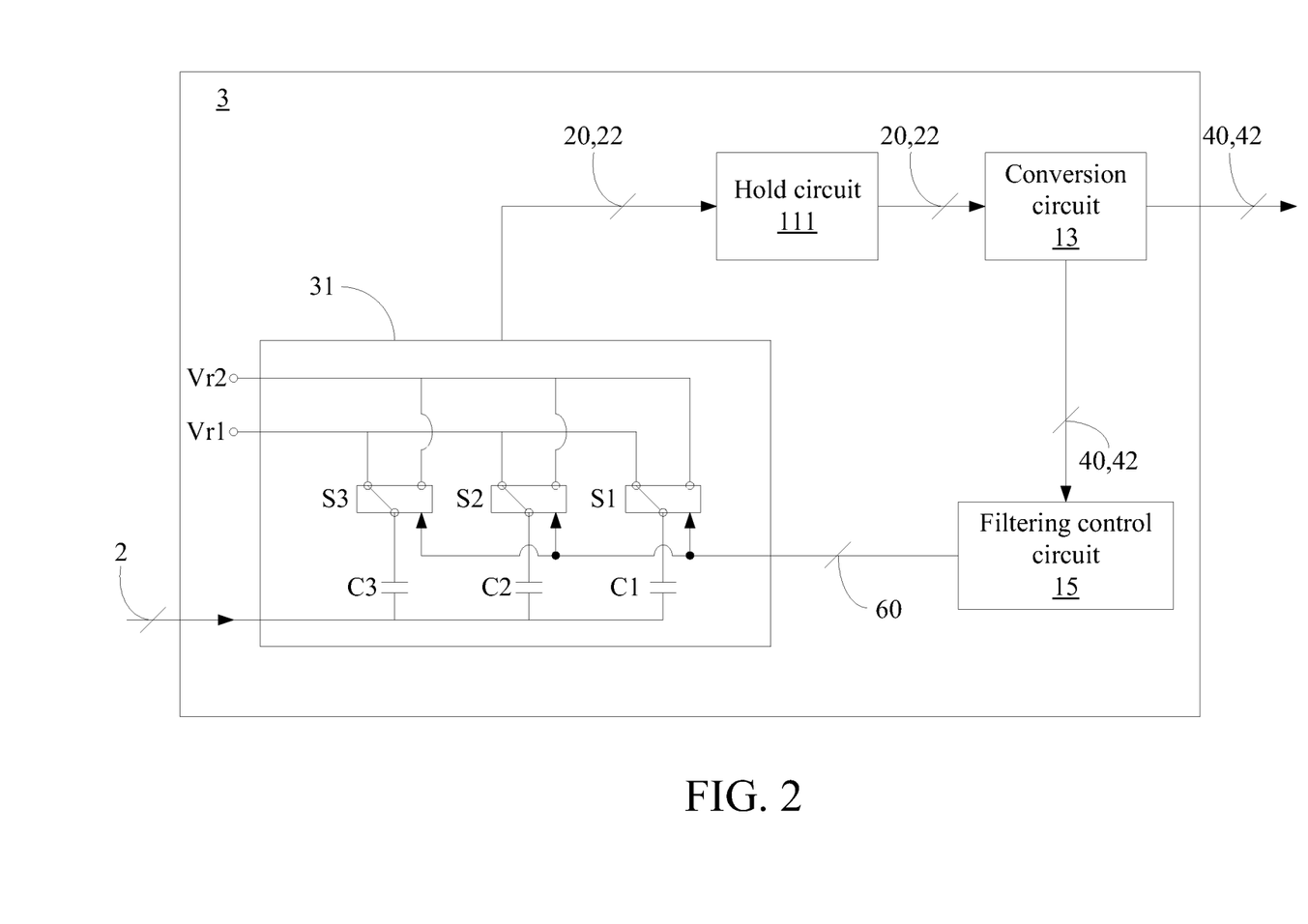
FIG. 2 is a schematic view of a successive approximation A/D converter 3 according to a second embodiment of the present invention.

A second embodiment of the present invention is another successive approximation A/D converter, which will be elucidated with reference to FIG. 2. FIG. 2 is a schematic view of a successive approximation A/D converter 3 of this embodiment. The successive approximation A/D converter 3 comprises a sample circuit 31, a hold circuit 111, a conversion circuit 13 and a filtering control circuit 15. It shall be appreciated that except for components that are specially described in this embodiment, the other components can all be understood as the corresponding components in the aforesaid embodiment; and some reference numerals identical to those of the aforesaid embodiment will still be used in this embodiment to represent substantially the same or similar components. For technical contents related to the aforesaid embodiment, they can be readily known from the aforesaid embodiment and, thus, will not be further described in this embodiment.

As shown in FIG. 2, the successive approximation A/D converter 3 differs from the successive approximation A/D converter 1 of the first embodiment in that the sample circuit 31 is an M-bit sample circuit, where M is a positive integer. For convenience of description, it is supposed that M is equal to three in this embodiment; that is, the sample circuit 31 will be viewed as a three-bit sample circuit. It shall be appreciated that the value of M can be changed depending on the designer's needs without any influence on the normal operation of the successive approximation A/D converter 3 of this embodiment.

When M is equal to three, the sample circuit 31 comprises three parallel branches in total, and each of the branches may comprise a switch and a capacitor. As shown in FIG. 2, the first branch comprises a switch S1 and a capacitor C1 coupled to the switch S1; the second branch comprises a switch S2 and a capacitor C2 coupled to the switch S2; and the third branch comprises a switch S3 and a capacitor C3 coupled to the switch S3. It shall be appreciated that the number of the switches and the capacitors described in this embodiment is not intended to limit the present invention.

Each of the capacitors (capacitor C1, the capacitor C2 and the capacitor C3) has a first terminal thereof coupled to the analog signal 2. Each of the switches (switch S1, the switch S2 and the switch S3) may be any type of switch having a single input and double outputs. Input terminals (first terminals) of the switches are coupled to second terminals of the capacitor C1, the capacitor C2 and the capacitor C3 respectively, and output terminals (second terminals) of the switches are coupled to one of a first reference voltage Vr1 and a second reference voltage Vr2 according to the filtering control signal 60. The first reference voltage Vr1 and the second reference voltage Vr2 have different voltage values.

The filtering control circuit 15 generates and transmits the filtering control signal 60 to the sample circuit 31 according to the digital voltage 40 outputted by the conversion circuit 13. The filtering control signal 60 is used to control the switch S1, the switch S2 and the switch S3 of the sample circuit 31 so that the output terminals of the switches are coupled to one of the first reference voltage Vr1 and the second reference voltage Vr2. The capacitor of each of the branches has a capacitance value twice of that of the capacitor of the next one of the branches; that is, the capacitor C3 has a capacitance value twice that of the capacitor C2. The capacitor C2 has a capacitance value twice that of the capacitor C1. For example, if the capacitance value of the capacitor C3 is 8 farads, then the capacitance value of the capacitor C2 is 4 farads and the capacitance value of the capacitor C1 is 2 farads.

With the aforesaid arrangement, the first terminals of the capacitor C1, the capacitor C2 and the capacitor C3 can be used to receive the analog voltage(s) 20 of the analog signal 2, and the second terminals of these capacitors are coupled to one of the first reference voltage Vr1 and the second reference voltage Vr2 through switching the switch S1, the switch S2 and the switch S3. Because the first reference voltage Vr1 and the second reference voltage Vr2 have different voltage values, the capacitor of each of the branches will store different voltages therein according to the switching of branches.

For example, suppose that the voltage value of the first reference voltage Vr1 is larger than the voltage value of the second reference voltage Vr2. Then, when the second terminal of the switch of one of the branches switches to the first reference voltage Vr1, a relatively low voltage will be stored in the capacitor of the branch because the voltage difference between the two terminals of the capacitor is relatively small. On the contrary, when the second terminal of the switch of the branch switches to the second reference voltage Vr2, a relatively high voltage will be stored in the capacitor of the branch because the voltage difference between the two terminals of the capacitor is relatively large.

Hereinafter, the method in which the successive approximation A/D converter 3 of this embodiment delivers the filtering effect will be further illustrated. As described in the first embodiment, when the successive approximation A/D converter 3 is to deliver the high-pass filtering effect, the filtering control signal 60 generated by the filtering control circuit 15 must satisfy the condition that the next digital voltage 42 is equal to the next analog voltage 21 minus a product of a digital voltage 40 with a filtering factor (which may be adjusted depending on different filtering requirements). In other words, the filtering control signal 60 generated by the filtering control circuit 15 must satisfy the following expression:

$$D(n) = V(n) - \alpha \times D(n-1) \quad (1)$$

where D(n) represents a digital voltage (e.g., the next digital voltage 42) that is outputted by the conversion circuit 13 for the $n^{th}$ time, V(n) represents an analog voltage (e.g., the next analog voltage 21) that is sampled for the $n^{th}$ time, D(n−1) represents a digital voltage (e.g., the digital voltage 40) that is outputted by the conversion circuit 13 for the $(n-1)^{th}$ time, and a represents a filtering factor which can be changed depending on the designer's needs.

If the expression (1) is satisfied, the second terminals of the switch S1, the switch S2 and the switch S3 of the sample circuit 31 will switch between the first reference voltage Vr1 and the second reference voltage Vr2 according to the filtering control signal 60 generated by the filtering control circuit 15. In other words, by switching the second terminals of the switch S1, the switch S2 and the switch S3 of the sample circuit 31 between the first reference voltage Vr1 and the second reference voltage Vr2, the definition of the expression (1) can be satisfied by the successive approximation A/D converter 3.

For example, suppose that $\alpha_k$ is equal to 0.5 and the filtering control signal 60 generated by the filtering control circuit 15 for the $n^{th}$ time is defined as Z(n), then the sample circuit 31 will adjust the next analog voltage 21 into an adjusted analog voltage 22 according to Z(n), as shown by the following expression:

$$V_o(n)=V(n)/(1-0.5 \times Z^{-1}(n)) \quad (2)$$

where $V_o(n)$ represents an adjusted analog voltage 22, and V(n) represents an analog voltage (e.g., the next analog voltage 21) that is sampled for the $n^{th}$ time.

The filtering control circuit 15 may also generate and transmit the filtering control signal 60 to the sample circuit 31 according to a plurality of digital voltages 40 previously outputted by the conversion circuit 13 instead of only a single digital voltage 40 previously outputted by the conversion circuit 13. In this case, a plurality of analog voltages 20 can be sampled by the sample circuit 31 from the analog signal 2 and is converted by the conversion circuit 13 into a plurality of digital voltages 40, and then the filtering control circuit 15 can generate and transmit the filtering control signal 60 to the sample circuit 31 according to the digital voltages 40. In other words, the filtering control signal 60 generated by the filtering control circuit 15 must satisfy the following expression:

$$D(n) = V(n) - \sum_k \alpha_k \times D_k(n-1) \quad (3)$$

where k represents the number of the digital voltages 40.

On the other hand, as described in the first embodiment, when the successive approximation A/D converter 3 is to deliver the low-pass filtering effect, the filtering control signal 60 generated by the filtering control circuit 15 must satisfy the condition that the next digital voltage 42 is equal to the next analog voltage 21 plus a product of a digital voltage 40 with a filtering factor (which may be adjusted depending on different filtering requirements). In other words, the filtering control signal 60 generated by the filtering control circuit 15 must satisfy the following expression:

$$D(n)=V(n)+\alpha \times D(n-1) \quad (4)$$

where D(n) represents a digital voltage (e.g., the next digital voltage 42) that is outputted by the conversion circuit 13 for the $n^{th}$ time, V(n) represents an analog voltage (e.g., the next analog voltage 21) that is sampled for the $n^{th}$ time, D(n−1) represents a digital voltage (e.g., the digital voltage 40) that is outputted by the conversion circuit 13 for the $(n-1)^{th}$ time, and a represents a filtering factor which can be changed depending on the designer's needs.

The filtering control circuit 15 may also generate and transmit the filtering control signal 60 to the sample circuit 31 according to a plurality of digital voltages 40 previously outputted by the conversion circuit 13 instead of only a single digital voltage 40 previously outputted by the conversion circuit 13. In this case, a plurality of analog voltages 20 can be sampled by the sample circuit 31 from the analog signal 2 and converted by the conversion circuit 13 into a plurality of digital voltages 40, and then, the filtering control circuit 15 can generate and transmit the filtering control signal 60 to the sample circuit 31 according to the digital voltages 40. In other words, the filtering control signal 60 generated by the filtering control circuit 15 must satisfy the following expression:

$$D(n) = V(n) + \sum_k \alpha_k \times D_k(n-1) \quad (5)$$

where k represents the number of the digital voltages 40.

It shall be appreciated that when the successive approximation A/D converter 3 needs to have a band-pass filtering function or a band-rejection filtering function, the successive approximation A/D converter 3 may also be designed through a process flow similar to what has been described above, and thus, will not be further described herein.

Through the aforesaid operations of this embodiment, the output result obtained after the analog signal 2 is converted by the successive approximation A/D converter 3 will be equivalent to an output result obtained after the analog signal 2 is first passed through a filter and is then converted by a conventional successive approximation A/D converter.

It shall be appreciated that in other embodiments of the present invention, the sample circuit 31 and the hold circuit 111 may be a part of the conversion circuit 13, i.e., may be built in the conversion circuit 13; and this will not affect the normal operation of the successive approximation A/D converter 3 of this embodiment. In practice, the sample circuit 31, the hold circuit 111 and the conversion circuit 13 may share a part of circuit therebetween, which switches between the sampling stage, the holding stage and the converting stage through the switching of switches, thereby, reducing the manufacturing cost and the circuit area. When the aforesaid circuit architecture is adopted, the present invention can have a similar circuit configuration to the conventional charge-distribution successive approximation A/D converter; however, the conventional charge-distribution successive approximation A/D converter per se does not have the aforesaid filtering function of the successive approximation A/D converter 3 of this embodiment.

In addition to the aforesaid operations, the successive approximation A/D converter 3 of this embodiment can also execute all the operations and functions set forth about the successive approximation A/D converter 1 of the first embodiment. The method in which the successive approximation A/D converter 3 of this embodiment executes these operations and functions can be readily appreciated by those of ordinary skill in the art based on the explanation of the first embodiment, and thus, will not be further described herein.

Figure 3:
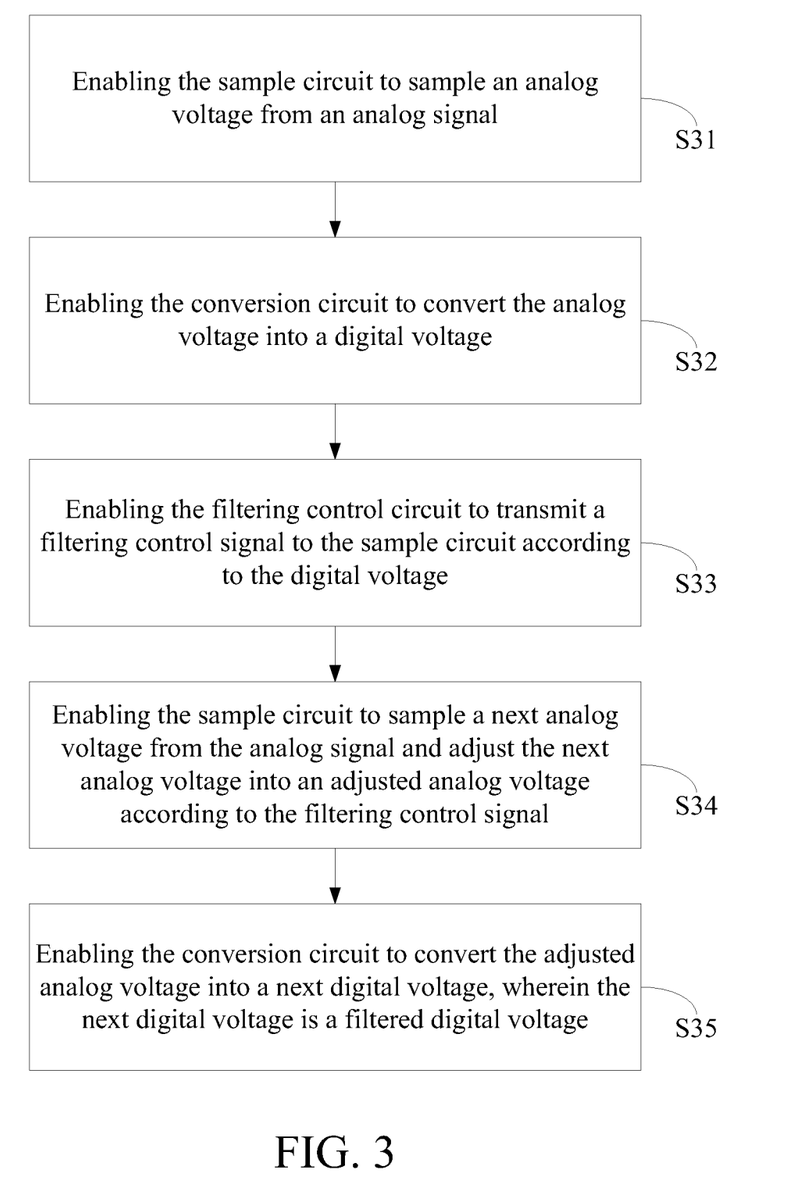
FIG. 3 is a flowchart of a conversion method for a successive approximation A/D converter according to a third embodiment of the present invention.

A third embodiment of the present invention is a conversion method for a successive approximation A/D converter, which will be elucidated with reference to FIG. 3. FIG. 3 is a flowchart of the conversion method for a successive approximation A/D converter of this embodiment. The successive approximation A/D converter may be the successive approximation A/D converter 1 of the first embodiment or the successive approximation A/D converter 3 of the second embodiment. Therefore, the successive approximation A/D converter may comprise a sample circuit (which may comprise a hold circuit), a conversion circuit and a filtering control circuit. The conversion circuit is coupled to the sample circuit. The filtering control circuit is coupled to the sample circuit and the conversion circuit.

As shown in FIG. 3, step S31 is executed to enable the sample circuit to sample an analog voltage from an analog signal. Step S32 is executed to enable the conversion circuit to convert the analog voltage into a digital voltage. Step S33 is executed to enable the filtering control circuit to transmit a filtering control signal to the sample circuit according to the digital voltage. Step S34 is executed to enable the sample circuit to sample a next analog voltage from the analog signal and adjust the next analog voltage into an adjusted analog voltage according to the filtering control signal. Step S35 is executed to enable the conversion circuit to convert the adjusted analog voltage into a next digital voltage, wherein the next digital voltage is a filtered digital voltage. The next digital voltage is generated according to the next analog voltage and the digital voltage.

As described in the second embodiment, the sample circuit may be an M-bit sample circuit, where M is a positive integer. The M-bit sample circuit comprises M parallel branches, and each of the branches comprises a switch and a capacitor coupled to the switch. The capacitor of each of the branches is coupled to the analog signal. In this case, the switch of each of the branches can be coupled to one of a first reference voltage and a second reference voltage according to the filtering control signal in the step S34 so as to adjust the next analog voltage into an adjusted analog voltage. The first voltage is different from the second voltage.

It shall be appreciated that in addition to the aforesaid steps, the third embodiment can also execute all the operations and functions set forth in the aforesaid embodiments. The method in which the conversion method of the third embodiment executes these operations and functions can be readily appreciated by those of ordinary skill in the art based on the explanation of the aforesaid embodiments, and thus, will not be further described herein.

Figure 4:
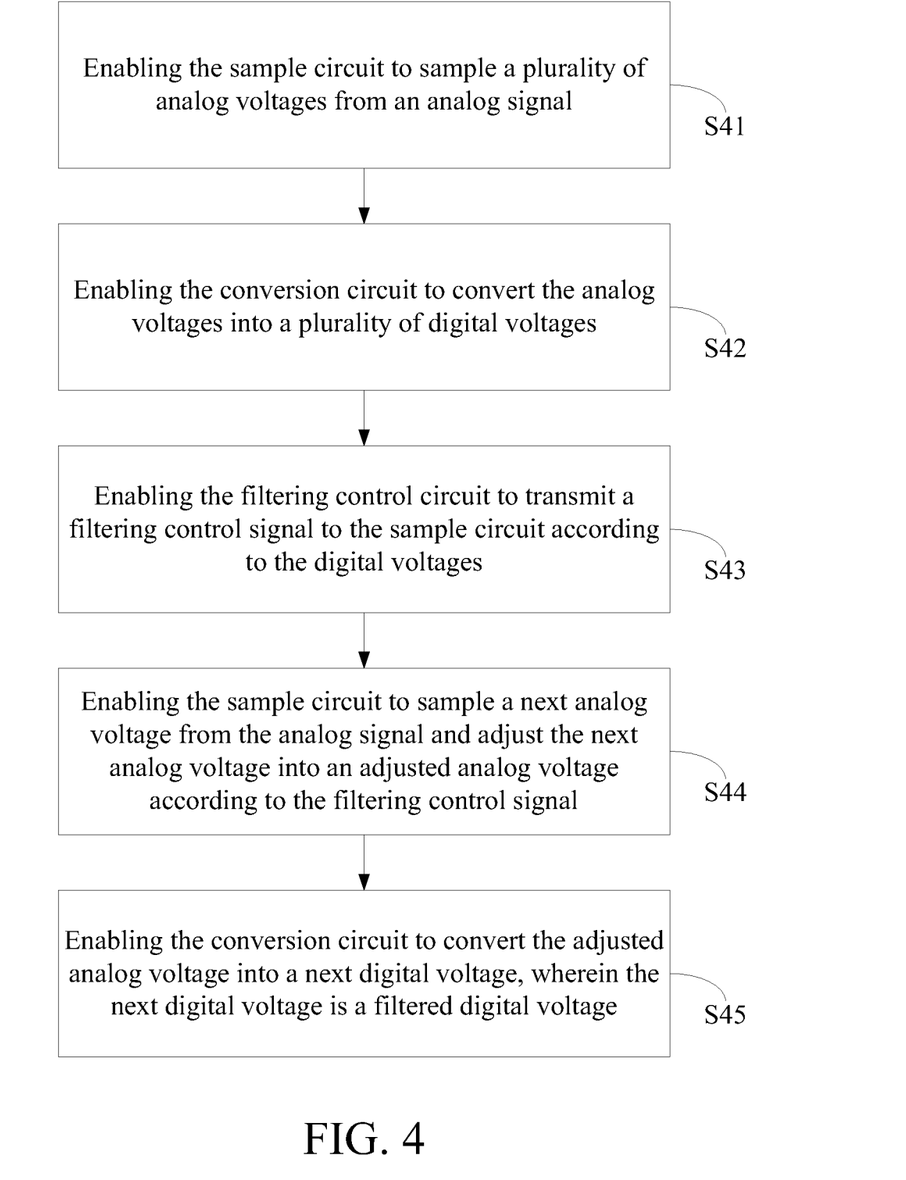
FIG. 4 is a flowchart of a conversion method for a successive approximation A/D converter according to a fourth embodiment of the present invention.

A fourth embodiment of the present invention is another conversion method for a successive approximation A/D converter according to the present invention, which will be elucidated with reference to FIG. 4. FIG. 4 is a flowchart of the conversion method for a successive approximation A/D converter of this embodiment. The successive approximation A/D converter may be the successive approximation A/D converter 1 of the first embodiment or the successive approximation A/D converter 3 of the second embodiment. Therefore, the successive approximation A/D converter may comprise a sample circuit (which may comprise a hold circuit), a conversion circuit and a filtering control circuit. The conversion circuit is coupled to the sample circuit, and the filtering control circuit is coupled to the sample circuit and the conversion circuit.

As shown in FIG. 4, step S41 is executed to enable the sample circuit to sample a plurality of analog voltages from an analog signal. Step S42 is executed to enable the conversion circuit to convert the analog voltages into a plurality of digital voltages. Step S43 is executed to enable the filtering control circuit to transmit a filtering control signal to the sample circuit according to the digital voltages. Step S44 is executed to enable the sample circuit to sample a next analog voltage from the analog signal and adjust the next analog voltage into an adjusted analog voltage according to the filtering control signal. Step S45 is executed to enable the conversion circuit to convert the adjusted analog voltage into a next digital voltage, wherein the next digital voltage is a filtered digital voltage. The next digital voltage is generated according to the next analog voltage and the digital voltage.

As described in the second embodiment, the sample circuit may be an M-bit sample circuit, where M is a positive integer. The M-bit sample circuit comprises M parallel branches, and each of the branches comprises a switch and a capacitor coupled to the switch. The capacitor of each of the branches is coupled to the analog signal. In this case, the switch of each of the branches can be coupled to one of a first reference voltage and a second reference voltage according to the filtering control signal in the step S44 so as to adjust the next analog voltage into an adjusted analog voltage. The first voltage is different from the second voltage.

It shall be appreciated that in addition to the aforesaid steps, the fourth embodiment can also execute all the operations and functions set forth in the aforesaid embodiments. The method in which the conversion method of the fourth embodiment executes these operations and functions can be readily appreciated by those of ordinary skill in the art based on the explanation of the aforesaid embodiments, and thus, will not be further described herein.

According to the above descriptions, the successive approximation A/D converter and the conversion method thereof according to the present invention can adjust an analog voltage currently sampled according to a digital voltage obtained from at least a previous conversion. Thereby, after the analog voltage currently sampled is converted into another digital voltage, the another digital voltage will have already been filtered. Because the successive approximation A/D converter and the conversion method thereof of the present invention can achieve an equivalent filtering effect without using an additional filter, the circuit area and cost can be effectively reduced as compared to the conventional A/D converter where an additional filter must be used to provide the filtering function.

The above disclosure is related to the detailed technical contents and inventive features thereof. Persons skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A successive approximation analog to digital (A/D) converter, comprising:
   a sample circuit, for sampling an analog voltage from an analog signal;
   a conversion circuit, coupled to the sample circuit, for converting the analog voltage into a digital voltage; and
   a filtering control circuit, coupled to the sample circuit and the conversion circuit, for transmitting a filtering control signal to the sample circuit according to the digital voltage;
   wherein the sample circuit further samples a next analog voltage from the analog signal and adjusts the next analog voltage into an adjusted analog voltage according to the filtering control signal, the conversion circuit further converts the adjusted analog voltage into a next digital voltage, and the next digital voltage is a filtered digital voltage; and
   wherein the next digital voltage is generated according to that the next analog voltage plus a product of the digital voltage with a filtering factor so that the next digital voltage has a low-pass filtering characteristic.

2. The successive approximation analog to digital converter as claimed in claim 1, wherein the sample circuit is an M-bit sample circuit, where M is a positive integer.

3. The successive approximation analog to digital converter as claimed in claim 2, wherein the M-bit sample circuit comprises M parallel branches, each of the branches comprises a switch and a capacitor coupled to the switch, the capacitor of each of the branches is coupled to the analog signal, the switch of each of the branches is coupled to one of a first reference voltage and a second reference voltage according to the filtering control signal, and the first voltage is different from the second voltage.

4. The successive approximation analog to digital converter as claimed in claim 3, wherein the switch of each of the branches has a first terminal and a second terminal, the capacitor of each of the branches has a first terminal and a second terminal, the first terminal of the capacitor is coupled to the analog signal, the second terminal of the capacitor is coupled to the first terminal of the switch, and the second terminal of the switch is coupled to one of the first reference voltage and the second reference voltage according to the filtering control signal.

5. The successive approximation analog to digital converter as claimed in claim 3, wherein the capacitor of each of the branches has a capacitance value twice that of the capacitor of the next one of the branches.

6. The successive approximation analog to digital converter as claimed in claim 1, wherein the sample circuit is a portion of the conversion circuit.

7. The successive approximation analog to digital converter as claimed in claim 1, wherein the sample circuit samples a plurality of analog voltages from the analog signal, the conversion circuit converts the analog voltages into a plurality of digital voltages, and the filtering control circuit transmits the filtering control signal to the sample circuit according to the digital voltages.

8. A conversion method for a successive approximation analog to digital converter, the successive approximation analog to digital converter comprising a sample circuit, a conversion circuit and a filtering control circuit, the conversion circuit being coupled to the sample circuit, and the filtering control circuit being coupled to the conversion circuit, the conversion method comprising the following steps of:
   (a) enabling the sample circuit to sample an analog voltage from an analog signal;
   (b) enabling the conversion circuit to convert the analog voltage into a digital voltage;
   (c) enabling the filtering control circuit to transmit a filtering control signal to the sample circuit according to the digital voltage;
   (d) enabling the sample circuit to sample a next analog voltage from the analog signal and adjust the next analog voltage into an adjusted analog voltage according to the filtering control signal; and
   (e) enabling the conversion circuit to convert the adjusted analog voltage into a next digital voltage, wherein the next digital voltage is a filtered digital voltage;
   wherein the next digital voltage is generated according to the next analog voltage and the digital voltage, and the next digital voltage is equal to the next analog voltage plus a product of the digital voltage with a filtering factor so that the next digital voltage has a low-pass filtering characteristic.

9. The conversion method as claimed in claim 8, wherein the sample circuit is an M-bit sample circuit, where M is a positive integer, the M-bit sample circuit comprises M parallel branches, each of the branches comprises a switch and a capacitor coupled to the switch, and the capacitor of each of the branches is coupled to the analog signal, the conversion method further comprising the following step of:
   (d1) enabling the switch of each of the branches to be coupled to one of a first reference voltage and a second reference voltage according to the filtering control signal in the step (d), wherein the first voltage is different from the second voltage.

10. A successive approximation analog to digital (A/D) converter, comprising:
    a sample circuit, for sampling an analog voltage from an analog signal;
    a conversion circuit, coupled to the sample circuit, for converting the analog voltage into a digital voltage; and
    a filtering control circuit, coupled to the sample circuit and the conversion circuit, for transmitting a filtering control signal to the sample circuit according to the digital voltage;

wherein the sample circuit further samples a next analog voltage from the analog signal and adjusts the next analog voltage into an adjusted analog voltage according to the filtering control signal, the conversion circuit further converts the adjusted analog voltage into a next digital voltage, and the next digital voltage is a filtered digital voltage; and wherein the next digital voltage is generated according to that the next analog voltage minus a product of the digital voltage with a filtering factor so that the next digital voltage has a high-pass filtering characteristic.

11. The successive approximation analog to digital converter as claimed in claim 10, wherein the sample circuit is an M-bit sample circuit, where M is a positive integer.

12. The successive approximation analog to digital converter as claimed in claim 11, wherein the M-bit sample circuit comprises M parallel branches, each of the branches comprises a switch and a capacitor coupled to the switch, the capacitor of each of the branches is coupled to the analog signal, the switch of each of the branches is coupled to one of a first reference voltage and a second reference voltage according to the filtering control signal, and the first voltage is different from the second voltage.

13. The successive approximation analog to digital converter as claimed in claim 12, wherein the switch of each of the branches has a first terminal and a second terminal, the capacitor of each of the branches has a first terminal and a second terminal, the first terminal of the capacitor is coupled to the analog signal, the second terminal of the capacitor is coupled to the first terminal of the switch, and the second terminal of the switch is coupled to one of the first reference voltage and the second reference voltage according to the filtering control signal.

14. The successive approximation analog to digital converter as claimed in claim 12, wherein the capacitor of each of the branches has a capacitance value twice that of the capacitor of the next one of the branches.

15. The successive approximation analog to digital converter as claimed in claim 10, wherein the sample circuit is a portion of the conversion circuit.

16. The successive approximation analog to digital converter as claimed in claim 10, wherein the sample circuit samples a plurality of analog voltages from the analog signal, the conversion circuit converts the analog voltages into a plurality of digital voltages, and the filtering control circuit transmits the filtering control signal to the sample circuit according to the digital voltages.

17. A conversion method for a successive approximation analog to digital converter, the successive approximation analog to digital converter comprising a sample circuit, a conversion circuit and a filtering control circuit, the conversion circuit being coupled to the sample circuit, and the filtering control circuit being coupled to the conversion circuit, the conversion method comprising the following steps of:
    (a) enabling the sample circuit to sample an analog voltage from an analog signal;
    (b) enabling the conversion circuit to convert the analog voltage into a digital voltage;
    (c) enabling the filtering control circuit to transmit a filtering control signal to the sample circuit according to the digital voltage;
    (d) enabling the sample circuit to sample a next analog voltage from the analog signal and adjust the next analog voltage into an adjusted analog voltage according to the filtering control signal; and (e) enabling the conversion circuit to convert the adjusted analog voltage into a next digital voltage, wherein the next digital voltage is a filtered digital voltage;

wherein the next digital voltage is generated according to the next analog voltage and the digital voltage and the next digital voltage is equal to the next analog voltage minus a product of the digital voltage with a filtering factor so that the next digital voltage has a high-pass filtering characteristic.

18. The conversion method as claimed in claim 17, wherein the sample circuit is an M-bit sample circuit, where M is a positive integer, the M-bit sample circuit comprises M parallel branches, each of the branches comprises a switch and a capacitor coupled to the switch, and the capacitor of each of the branches is coupled to the analog signal, the conversion method further comprising the following step of:

(d1) enabling the switch of each of the branches to be coupled to one of a first reference voltage and a second reference voltage according to the filtering control signal in the step (d), wherein the first voltage is different from the second voltage.

* * * * *